United States Patent
Shalish et al.

(10) Patent No.: US 6,410,460 B1
(45) Date of Patent: Jun. 25, 2002

(54) TECHNOLOGY FOR THERMODYNAMICALLY STABLE CONTACTS FOR BINARY WIDE BAND GAP SEMICONDUCTORS

(75) Inventors: Ilan Shalish, Givatayim; Yoram Shapira, Even-Yehuda; Moshe Eizenberg, Haifa, all of (IL)

(73) Assignees: Ramot University Authority for Applied Research and Industrial Development Ltd., Tel Aviv; Technion Research and Development Foundation Ltd., Haifa, both of (IL)

(*) Notice: Subject to any disclaimer, the term of this patent is extended or adjusted under 35 U.S.C. 154(b) by 0 days.

(21) Appl. No.: 09/570,812

(22) Filed: May 15, 2000

(51) Int. Cl.[7] .................. H01L 21/31; H01L 21/469; H01L 21/44
(52) U.S. Cl. .................. 438/785; 438/682; 438/685; 438/686
(58) Field of Search .................. 438/785, 682, 438/685, 686

(56) References Cited

U.S. PATENT DOCUMENTS 5,442,200 A * 8/1995 Tischler .................. 257/77

OTHER PUBLICATIONS

Levit et al, "Interaction of $Ni_{90}Ti_{10}$ Alloy Thin Film with 6H–SiC Single Crystal", *Appl. Phys.*, 80(1):167–173, 1996.
DiBattista et al, "In–Situ Elevated Temperature Imaging of Thin Films with a Microfabricated Hot Stage For Scanning Probe Microscopes", *App. Surface Science*, 141:119–128, 1999.

* cited by examiner

Primary Examiner—Alexander G. Ghyka
(74) *Attorney, Agent, or Firm*—Mark M. Friedman

(57) ABSTRACT

A thermodynamically stable metallic contact for binary oxide-, nitride-, carbide or phosphide-semiconductors and a method of its preparation, the contact is formed in a high temperature reaction in vacuum of a metal bi-layer with the binary semiconductor substrate. With a proper choice of the two metallic layers, each metal forms a single phase with only one of binary semiconductor elements. The resulting phases form distinct layers in a thermodynamically stable sequence.

13 Claims, 1 Drawing Sheet

TECHNOLOGY FOR THERMODYNAMICALLY STABLE CONTACTS FOR BINARY WIDE BAND GAP SEMICONDUCTORS

BACKGROUND OF THE INVENTION

This invention relates to a process for the preparation of thermodynamically stable metallic contacts for binary oxide-, nitride-, carbide- or phosphide-semiconductors. The product of this invention, the metal-semiconductor contact, is a crucial building block in the making of any electronic device based on these semiconductors that is intended to be operated at high temperatures. In particular, this method is useful for making metal contacts to group III nitrides and to silicon carbides.

Metal contacts to modem silicon devices typically incorporate a transition-metal/silicide contacting layer. The formation of transition-metal silicides and their characteristics have been exhaustively investigated, and their current manufacturing technology provides a satisfactory solution for contacting silicon devices. On the other hand, for compound semiconductors, the search for contacting solutions is still widely pursued, while the primary obstacle is the added complexity of ternary reactions.

Despite the rapid built-up of ternary phase diagram knowledge base during the last decade, the ability to use it for stable contact design is limited. For example, the applicability of phase diagrams is limited to closed thermodynamic systems.

Maintaining a closed system is difficult in compounds such as Group III arsenides and nitrides since one of the elements is volatile. The complexity is also manifested in the reaction kinetics. As a result, in systems, such as silicon carbides, the obtained contact is typically composed of a mixture of phases, which is of limited use in the sub-micron regime and can affect the electrical characteristics of the contact.

An extensive technology of semiconductor devices has been developed based upon the properties of silicon and other materials with comparable band gap which may be doped, heat treated, and otherwise processed to produce adjacent layers and regions of varying electronic characteristics.

The use of devices produced from such semiconductors is generally limited to operation at ambient or, at most, moderately elevated temperatures and in non-corrosive, inert atmospheres. The temperature limitation is a consequence of the small band gap of these materials,(1–1.5 eV) which leads to large leakage currents and device failure at elevated temperatures. In addition, rapid diffusion of dopants and/or impurity species in the host material can occur, which in turn can substantially alter the character of the fabricated semiconductor device.

The limitation to relatively inert environments results from the high chemical reactivity of moderate band gap semiconductors (including silicon) to many corrosive environments, which also can alter the character of the fabricated device.

Such devices are also limited as to power level, frequency, and radiation tolerance by the materials used therein. For some applications, the temperature, environmental, and other use limitations on such devices may be overcome by the use of proper cooling and packaging techniques.

In other applications, these limitations have prevented the use of silicon for integrated circuit technology. For example, in many spacecraft and aircraft applications, elevated temperatures are encountered, and it is not always possible to insure that adequate cooling will be provided. In high power applications, device temperatures can rise to levels, which degrade or destroy the device solely through internal heating.

Silicon's inability to withstand high temperatures limits the amount of power, which can be generated or controlled by silicon electronics. In addition, internal thermal transients in devices otherwise operating at ambient temperature can rapidly destroy the operability of the device unless extensive cooling is provided. Such cooling requires that the device be larger in size than might otherwise be necessary, in part defeating the purpose of the integrated circuit technology.

There has therefore been an ongoing, but as yet not fully successful, search over a period of twenty years to identify and develop a semiconductor technology based in other materials. Such a technology would desirably allow the fabrication of devices for use at higher temperatures such as, for example, the range of at least about 400° C. to 600° C., and in applications not amenable to the use of silicon. Because corrosive effects can be greatly accelerated at elevated temperatures and pressures, any such materials and devices must also exhibit excellent corrosion resistance at the elevated use temperatures and over a range of pressures from vacuum to many atmospheres.

Some generally desirable characteristics of such materials have been identified, including large band gap., good electrical conductivity, high electric field breakdown strength, low dielectric constant, ability to be doped to produce regions of varying electronic characteristics, a high melting temperature, good strength at operating temperatures, resistance to diffusion by undesired foreign atoms, good thermal conductivity, thermal stability, chemical inertness, and the ability to form stable ohmic and rectifying external contacts.

The metal-semiconductor contact is a crucial building block in the making of any electronic device based on these semiconductors that is intended to be operated at high temperatures. However, at elevated temperatures the metal semiconductor junction appears to become unstable.

Attempts to achieve limited stability have been made using complex contacts composed of several layers, one of which is usually used as a diffusion barrier. A typical such contact is the Ti\Pt\Au contact, where the Pt layer serves as a diffusion barrier to prevent the reaction of Ti and Au. This and similar contacts have been used on most of the aforementioned binary semiconductors. However, this contact has a very limited lifetime at high temperatures (>300° C.) at which diffusion eventually occurs and the undesirable reaction takes place.

Silicon carbide serves as an example for a material meeting the indicated requirements of a semiconductor for high temperatures. Silicon carbide has a high decomposition temperature, good strength., good resistance to radiation damage and good corrosion resistance in many environments. Silicon carbide has a high breakdown field strength ten times that of silicon, a relatively large band gap, low dielectric constant, and a thermal conductivity of more than three times that of silicon at ambient temperature. The diffusion coefficients in silicon carbide are also much smaller than those in silicon or gallium arsenide, and so silicon carbide is resistant to the diffusion of impurity species. Silicon carbide may be processed by several techniques similar to those used in silicon device technology and in many instances silicon carbide devices may be substituted at moderate and low temperatures for silicon devices. Silicon carbide semiconductor device technology therefore offers the opportunity for supplementing, and in some instances replacing, conventional silicon device technology.

U.S. Pat. No. 5,442,200 to Tischler discloses a method to avoid the formation of more than one phase in contacting SiC using a sacrificial layer of Si.

A near-noble metal reacts with Si at temperatures lower than needed to start their reaction with SiC. This difference in temperatures can be used to obtain a full reaction with the Si while avoiding the reaction with the SiC. Thus, a silicide contact that is stable with the SiC substrate may be formed without the second phase of the carbon product that is formed in silicidation of SiC.

However, this type of contact may only serve as an ohmic contact, since it does not provide an "in-situ" formation of a new interface such as in the case of Si silicidation, which is required for high quality and reproducible Schottky barriers. Furthermore, at the high temperatures needed to obtain the ohmic characteristics described in U.S. Pat. No. 5,442,200 (1100° C.), a reaction with the SiC substrate may take place nevertheless. This reaction is probably quite limited since the inventor states that the final metallization may contain up to 5% carbon.

Levit et al. in $J. Appl. Phys.$ 80, 167 (1996), show that with a high temperature annealing the 10% Ti component of a Ni-Ti alloy contact react preferentially with the carbon product formed upon SiC silicidation with the Ni component of the alloy. Tile low percentage of Ti was deliberately made small to form a small perturbation to the Ni—SiC system.

However, this contact does not provide a solution for the carbon product due to the very small quantity of Ti. Moreover, the preparation of the alloy is a complicated process as compared to the more common layer-by-layer deposition.

SUMMARY OF THE INVENTION

It is therefore the object of the invention to provide a thermodynamically stable electrical contact to wide band gap binary semiconductors.

It is another object of the invention to provide such stable contacts having either ohmic or rectifying properties.

It is yet another object of the invention to provide a thermodynamically stable electrical contact to semiconductor devices operating at elevated temperatures.

It has now been found that a bi-layer metallic contact, composed of sequentially deposited layers of a reactive refractory transition metal element, i.e., a metal selected from column 4b in the periodic; table, such as Ti, Zr or Hf, followed by a near-noble metal, i.e., a metal selected from group 8 in the periodic table, such as Pt, Pd, Co, or Ni, can be used to form the desired thermodynamically stable contacts to oxide-, nitride-, phosphide- or carbide-binary compound semiconductor.

Upon annealing in vacuum at high temperatures (typically 900° C.), a reaction takes place between the semiconductor and the bi-layer metallization. The refractory metal reacts to form a compound with the less metallic element of the substrate, while the near-noble metal bonds with the other element, forming a distinct layer for each phase in a thermodynamically stable sequence.

In the cases where the less metallic element is volatile, the formed compound between the refractory metal and the less metallic element serves as a diffusion barrier to block further out-diffusion and decomposition of the substrate. In the cases where the less metallic element is non-volatile, this layer serves as a sink for the undesired product: that otherwise would have provided a second phase at the contact.

According to the invention there is provided a solid-state electronic device, comprising: (a) a binary substrate including a first element A and a second element D, D being less metallic than A, and, (b) an electrical contact including: (i) a first layer, in contact with the substrate, the first layer including a first binary compound of A with a metallic element X, and (ii) a second layer, in contact with the first layer, the second layer including a binary compound of D with a metallic element Z.

According to the invention there is provided an electrical contact for a binary substrate that includes a first element A and a second element D, D being less metallic than A, comprising: (a) a first layer, in contact with the substrate, the first layer including a first binary compound of A with a metallic element X; and (b) a second layer, in contact with the first layer, the second layer including a binary compound of D with a metallic element Z.

According to the invention there is provided a method for preparing a contact for a binary substrate including a first element A and a second element D, D being less metallic then A, comprising the steps of: (a) depositing a layer of Z metal on the substrate; (b) depositing of a layer of metal X on top of the layer of metal Z and, annealing the substrate with the deposited layers of metal X and of metal Z at a sufficient high temperature for a sufficient length of time to allow A and D of the substrate to react with the metal X and with the metal Z to yield the binaries of A with X and of Z with D respectively.

According to the invention there is provided a method for preparing a contact for a binary substrate that includes a first element A and a second element D, D being less metallic then A, comprising the steps of: (a) depositing a layer including a metal Z and a metal X on the substrate; and (b) annealing the substrate with the deposited layer at a sufficiently high temperature for a sufficient length of time, to allow A and D of the substrate to react with the metal X and with the metal Z to yield a first layer, in contact with the substrate, of a binary compound of A and X, and a second layer, in contact with the first layer, of a binary compound of D and Z.

DETAILED DESCRIPTION OF THE INVENTION

Figure 1:
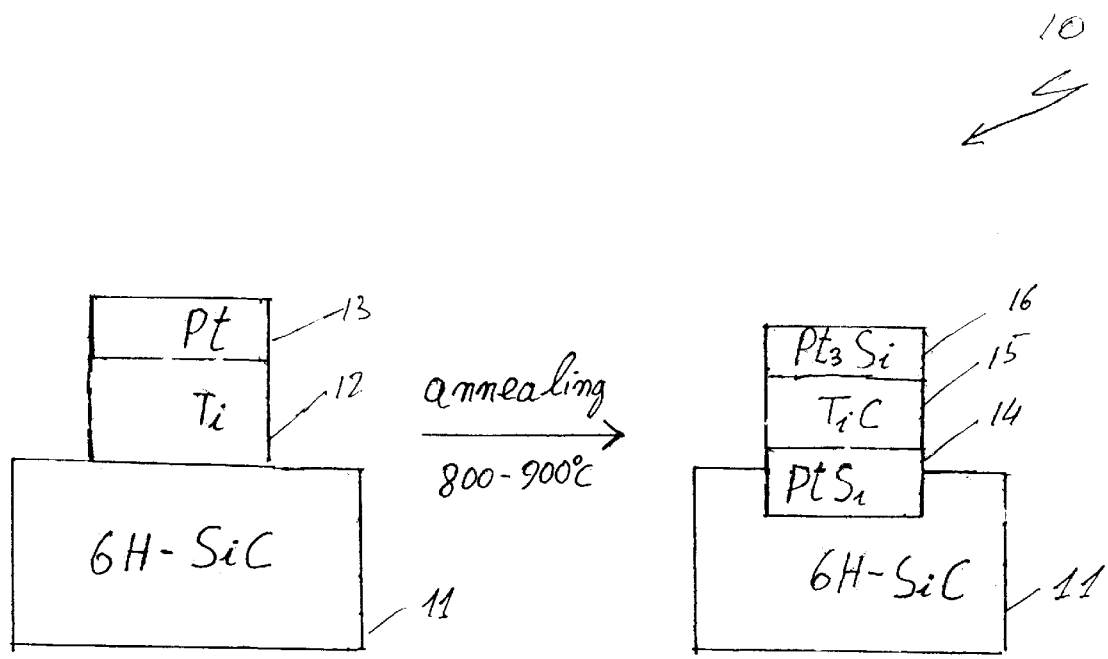
FIG. 1 depicts the schematic layer structure of <6H-SiC>\Ti\Pt contact before and after annealing.

The present embodiments herein are not intended to be exhaustive and to limit in any way the scope of the invention, rather they are used as examples for the clarification of the invention and for enabling of other skilled in the art to utilize its teaching. The main idea of the present invention is that of "variable separation", i.e., the use of a combination of refractory transition metal with a near-noble metal for the establishment of an electrical contact to a binary semiconductor which will be obtained by chemical reaction of the elements in the layer with the binary semiconductor in such a way that each element in the layer will react exclusively with one of the binary constituents.

Because both metals of the layer form an alloy already at temperatures as low as 400° C., (M. Dibattista, S. V. Patel, J. F. Mansfeld and J. W. Schwank, in $Appl. Surf Sci.$,141, 119, 1999), there is no need to deposit an alloy of these metals. Rather, a dual layer (regardless the order of deposition) of refractory transition metal and a near-noble metal is expected to perform as well as a pre-prepared deposited alloy.

For the SiC binary semiconductor, which is covered with a layer of Ti/Pt as an example, the Pt is known to react with the Si at much lower temperatures than the Ti does (at 200–300° C.). The carbon that is released is rejected from the platinum silicide phase and is available to react exclusively with the Ti at higher temperatures to yield TiC layer on top of the platinum silicide layer. This carbide layer serves as a diffusion barrier minimizing the unwanted reaction of Ti with Si.

Accordingly, the metal-semiconductor contact incorporates two layers. The first layer which is deposited is a reactive refractory transition metal, i.e., a metal selected from column 4b in the periodic table, such as Ti, Zr or Hf and the second deposited layer is that of a near-noble metal, i.e., a metal selected from group 8 in the periodic table, such as Pt, Pd, Co, or Ni.

This way, the near-noble metal layer, deposited on top of the first layer, serves as a capping layer to prevent oxidation of the first refractive layer, when the samples are taken out of the vacuum deposition chamber.

The amount of the, first metal layer exceeds (double) the amount of material required for the formation of stoichiometric compound with the less metallic element released from the semiconductor. This is because during the process of gettering the less metallic element by the refractory metal, a diffusion barrier is built up, progressively slowing down the gettering process and finally altogether inhibiting it.

With the stoichiometric relations, the process stops before the less metallic element can be fully removed from the contact layer. The layers are made thin enough to allow the system to reach thermodynamic equilibrium within a reasonable annealing time. The optimal thickness is to be established separately for each substrate and metal combination and can be easily established by those skilled in the art.

The depositions are carried out under vacuum of at least $1 \cdot 10^{-6}$ Torr, preferably at $1 \cdot 10^{-7}$ Torr or better and at a rate fast enough to prevent incorporation of residual molecules from the vacuum system gas phase into the reactive refractory metal layer. Following the deposition, the samples are annealed in vacuum for 1 hour at 900° C. During the annealing the following sequence of processes takes place:

[1] The two metals interdiffuse, forming an alloy.
[2] The near-noble metal from the alloy reacts with the more metallic element of the substrate releasing the remaining less metallic element.
[3] The less metallic element diffuses out to be gettered by the free refractory metal that remains from the alloy.
[4] The refractory metal and the less metallic element build up a diffusion barrier layer that gradually impedes diffusion until it is altogether inhibited. The following example is provided to further illustrate this invention and the manner in which it may be carried out. It will be understood, however, that the specific details given in the example have been chosen for illustration only and are not to be construed as limiting the invention.

EXAMPLE 1

Preparation of Ti\Pt contact for 6H-SiC.

Two metallic layers were deposited sequentially without breaking the vacuum, using e-beam thermal deposition under vacuum of $1 \cdot 10^{-8}$ Torr onto two 6H-SiC substrate samples. The substrates (11 in FIG. 1) were neither cooled nor heated externally.

As shown schematically in FIG. 1, the first layer 12 consisted of Ti and was 16-nm-thick. The second layer 13 consisted of Pt and was 8-nm-thick. One sample was kept as a reference while the other was heat-treated in an evacuated tube furnace under vacuum of $1 \cdot 10^{-7}$ Torr for an hour at 800° C. and for another hour at 900° C.

Then the samples were depth-profiled using x-ray photo-electron spectroscopy (XPS) in conjunction with ion sputtering. The craters, formed by the sputtering, were analyzed using crater edge scanning Auger microscopy. The XPS results were used for chemical identification of the phases, while the crater edge profiling was used to obtain structural information about the formed layers.

The results of the surface analytical depth profile were interpreted according to a schematic layered structure depicted in FIG. 1 which support the sequence of processes at 900° C. which was described before ([1]–[4]): First, the near-noble metal and Ti inter-diffuse, forming a Ti-near-noble intermetallic (not shown).

Next, the near noble metal reacts with the semiconductor substrate The nonmetallic element released from the substrate in this reaction process, C for SiC (or N for GaN) is gettered by either free Ti, or by Ti extracted from the Ti-near-noble intermetallic, to form the more stable Ti-less metallic-element phase (e.g. TiC).

The less metallic element, gettered by the Ti, builds up a diffusion barrier layer 15, resisting the transport of the near-noble metal atoms towards the substrate. This transport is thereby reduced and eventually altogether inhibited.

The near-noble metal atoms located below the barrier react with the substrate, forming a separate phase 14, which is thermodynamically stable with both the substrate and the adjacent diffusion barrier layer, establishing thermodynamic equilibrium.

A marginal amount of silicon penetrates the barrier layer 14 on its way out and alloys with near-noble metal to produce an over layer 16, having metallic characteristics.

The layers shown in FIG. 1 have physical metallurgical boundaries, i.e., elements of adjacent layers inter-diffuse to a certain extent into each other layer, causing the adjacent layers to be in intimate contact. It is such boundaries, rather then mere mechanical contact between the layers that is meant when a layer is described as being "in contact" with another layer or with the substrate.

While the invention has been described with respect to a limited number of embodiments, it will be appreciated that many variations, modifications and other applications of the invention may be made.

What is claimed is:

1. A method for preparing a contact for a binary substrate that includes a first element A and a second element D, D being less metallic then A, comprising the steps of:

(a) depositing a layer of a metal Z on the substrate;

(b) depositing of a layer of a metal X on top of said layer of metal Z and (c) annealing the substrate with said deposited layers of metal X and of metal Z at a sufficiently high temperature for a sufficient length of time, to allow A and D of the substrate to react with said metal X and with said metal Z to yield a first layer, in contact with the substrate, of a binary compound of A and X, and a second layer, in contact with said first layer, of a binary compound of D and Z.

2. A method for preparing a contact for a binary substrate that includes a first element A and a second element D, D being less metallic then A, comprising the steps of:

(a) depositing a layer that includes a metal Z and a metal X on the substrate; and (b) annealing the substrate with said deposited layer at a sufficiently high temperature for a sufficient length of time, to allow A and D of the substrate to react with said metal X and with said metal Z to yield a first layer, in contact with the substrate, of a binary compound of A and X, and a second layer, in contact with said first layer, of a binary compound of D and Z.

3. The method of claim 1 or claim 2, wherein A is an element selected from the group consisting of Si, Ga and Al.

4. The method of claim 1 or claim 2, wherein D is an element selected from the group consisting of C, N, O and P.

5. The method of claim 1 or claim 2, wherein said metal Z is selected from the group consisting of Ti, Zr and Hf.

6. The method of claim 1 or claim 2, wherein said metal X is selected from the group consisting of Pt, Pd, Co, Ir and Ni.

7. The method of claim 1 wherein metal Z is deposited at a pressure of less than about $1 \cdot 10^{-6}$ Torr.

8. The method of claim 1, wherein metal X is deposited subsequently to said deposition of metal Z, and wherein the substrate remains under said reduced pressure from a start of said deposition of meal Z until an end of said deposition of metal X.

9. The method of claim 2, wherein said layer is deposited at a pressure of less than about $1 \cdot 10^{-6}$ Torr.

10. The method of claim 1 or claim 2, wherein said annealing temperature is between 700° C. to about 1100° C.

11. The method of claim 1, wherein metal Z is different from element A.

12. The method of claim 1, wherein metal X has a higher affinity for element A than does metal Z.

13. The method of claim 1, wherein metal Z has a higher affinity for element D than does metal X.

\* \* \* \* \*